United States Patent
Yazaki et al.

(10) Patent No.: US 10,964,645 B2
(45) Date of Patent: Mar. 30, 2021

(54) ELECTRONIC COMPONENT WITH THIN-FILM SHIELD LAYER

(71) Applicant: Murata Manufacturing Co., Ltd., Nagaokakyo (JP)

(72) Inventors: Hirokazu Yazaki, Nagaokakyo (JP); Keito Yonemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/538,942

(22) Filed: Aug. 13, 2019

(65) Prior Publication Data

US 2019/0363055 A1    Nov. 28, 2019

Related U.S. Application Data

(63) Continuation of application No. PCT/JP2018/005018, filed on Feb. 14, 2018.

(30) Foreign Application Priority Data

Feb. 28, 2017  (JP) .............................. JP2017-035703
Nov. 29, 2017  (JP) .............................. JP2017-228617

(51) Int. Cl.
    *H01L 23/552*    (2006.01)
    *B32B 15/08*    (2006.01)
    (Continued)

(52) U.S. Cl.
    CPC ............ *H01L 23/552* (2013.01); *B32B 15/08* (2013.01); *B32B 27/38* (2013.01); *H01L 23/29* (2013.01);
    (Continued)

(58) Field of Classification Search
    CPC ....... H01L 23/552; B32B 15/08; B32B 27/38; H05K 1/0216; H05K 1/0237; H05K 3/284;
    (Continued)

(56) References Cited

U.S. PATENT DOCUMENTS

2001/0038926 A1*  11/2001  Awakura ............... H01F 10/007
                                                    428/606
2003/0190498 A1   10/2003  Fujieda et al.
                           (Continued)

FOREIGN PATENT DOCUMENTS

JP    10-214923 A     8/1998
JP    2001-358493 A   12/2001
                    (Continued)

OTHER PUBLICATIONS

Official Communication issued in International Patent Application No. PCT/JP2018/005018, dated Apr. 24, 2018.

*Primary Examiner* — Scott B Geyer
(74) *Attorney, Agent, or Firm* — Keating & Bennett, LLP

(57) ABSTRACT

An electronic component including a thin-film shield layer includes a wiring substrate, surface mount devices mounted to a first principal surface of the wiring substrate, a metal thin-film shield layer, and a magnetic metal thin-film shield layer. The metal thin-film shield layer includes a nonmagnetic metal material and entirely covers the surface mount devices at the top surface side and lateral surface side thereof. The metal thin-film shield layer includes a top surface portion and a lateral surface portion. The magnetic metal thin-film shield layer includes a magnetic metal material and covers the top surface portion and the lateral surface portion of the metal thin-film shield layer, including an entire edge portion at which the top surface portion and the lateral surface portion are joined to each other.

19 Claims, 5 Drawing Sheets

(51) Int. Cl.
    B32B 27/38    (2006.01)
    H01L 23/29    (2006.01)
    H01L 23/31    (2006.01)
    H05K 1/02     (2006.01)
    H05K 3/28     (2006.01)
    H05K 5/06     (2006.01)
    H05K 9/00     (2006.01)

(52) U.S. Cl.
    CPC ....... H01L 23/3135 (2013.01); H05K 1/0216 (2013.01); H05K 1/0237 (2013.01); H05K 3/284 (2013.01); H05K 5/065 (2013.01); H05K 9/0024 (2013.01); H05K 2201/0715 (2013.01); H05K 2203/1316 (2013.01)

(58) Field of Classification Search
    CPC ................. H05K 5/065; H05K 9/0024; H05K 2201/0715; H05K 2203/1316
    See application file for complete search history.

(56) References Cited

U.S. PATENT DOCUMENTS

| | | | | |
|---|---|---|---|---|
| 2005/0045358 A1* | 3/2005 | Arnold | ................ | H05K 9/0024 174/51 |
| 2006/0038630 A1* | 2/2006 | Kawaguchi | .......... | H05K 1/0233 333/12 |
| 2006/0180880 A1* | 8/2006 | Wang | .................... | H01L 23/552 257/414 |
| 2009/0244878 A1* | 10/2009 | Wurzel | ................ | H01L 23/552 361/818 |
| 2010/0103058 A1* | 4/2010 | Kato | ................ | G06K 19/07786 343/702 |
| 2011/0006408 A1* | 1/2011 | Liao | ..................... | H01L 21/561 257/660 |
| 2011/0304015 A1* | 12/2011 | Kim | ...................... | H01L 25/105 257/532 |
| 2012/0168214 A1* | 7/2012 | Kashiwagi | .......... | H01L 23/3121 174/257 |
| 2014/0268625 A1* | 9/2014 | Sherrer | ................ | H01L 23/3135 361/818 |
| 2016/0093796 A1* | 3/2016 | Arai | ...................... | H01L 23/552 257/422 |
| 2016/0095267 A1 | 3/2016 | Kitazaki et al. | | |
| 2016/0284761 A1* | 9/2016 | Zhou | .................... | H01L 23/552 |
| 2017/0050842 A1* | 2/2017 | Yamada | ................ | G01R 33/093 |
| 2017/0200682 A1* | 7/2017 | Lin | ........................ | H01L 24/97 |
| 2017/0278804 A1 | 9/2017 | Kawabata et al. | | |
| 2017/0290207 A1* | 10/2017 | Smith | .................. | H05K 9/0088 |
| 2017/0294387 A1 | 10/2017 | Kawabata et al. | | |
| 2017/0301628 A1 | 10/2017 | Kawabata et al. | | |
| 2017/0309576 A1* | 10/2017 | Kawabata | .............. | H01L 25/50 |
| 2017/0347462 A1* | 11/2017 | Miwa | .................... | H05K 3/284 |
| 2018/0033738 A1* | 2/2018 | Kawabata | ................ | H01L 24/16 |
| 2018/0077829 A1* | 3/2018 | Yamamoto | .............. | B32B 15/08 |
| 2018/0132390 A1* | 5/2018 | Jeong | .................... | H05K 1/186 |
| 2019/0035744 A1* | 1/2019 | Kawabata | ............. | H01L 23/552 |

FOREIGN PATENT DOCUMENTS

| | | |
|---|---|---|
| JP | 2004-165278 A | 6/2004 |
| JP | 2011-77430 A | 4/2011 |
| JP | 2016-72411 A | 5/2016 |
| JP | 2016-72493 A | 5/2016 |
| JP | 5988003 B1 | 9/2016 |
| JP | 5988004 B1 | 9/2016 |
| JP | 2017-174949 A | 9/2017 |
| WO | 2010/103756 A1 | 9/2010 |
| WO | 2016/092694 A1 | 6/2016 |
| WO | 2016/186103 A1 | 11/2016 |

* cited by examiner

ELECTRONIC COMPONENT WITH THIN-FILM SHIELD LAYER

CROSS REFERENCE TO RELATED APPLICATIONS

This application claims the benefit of priority to Japanese Patent Application No. 2017-035703 filed on Feb. 28, 2017 and Japanese Patent Application No. 2017-228617 filed on Nov. 29, 2017, and is a Continuation Application of PCT Application No. PCT/JP2018/005018 filed on Feb. 14, 2018. The entire contents of each application are hereby incorporated herein by reference.

BACKGROUND OF THE INVENTION

1. Field of the Invention

The present invention relates to an electronic component including a circuit substrate, a surface mount device mounted to the circuit substrate, and a shield covering a surface of the circuit substrate.

2. Description of the Related Art

Electronic components including various surface mount devices mounted to substrates have been used in many electronic devices. For example, Japanese Unexamined Patent Application Publication No. 2011-77430, Japanese Patent No. 5988003, and Japanese Patent No. 5988004 disclose electronic circuit packages of that type of electronic components.

The electronic component (module) disclosed in Japanese Unexamined Patent Application Publication No. 2011-77430 includes a substrate, a surface mount device, a sealing portion, and a metal film.

The surface mount device is mounted to a surface of the substrate. The sealing portion covers the surface of the substrate. The metal film covers an outermost surface defined by both the sealing portion and the substrate.

The electronic component (electronic circuit package) disclosed in Japanese Patent No. 5988003 includes a substrate, a plurality of surface mount devices, a molded resin, a magnetic film, and a metal film.

The surface mount devices are mounted to a surface of the substrate. The molded resin covers the surface of the substrate, and the magnetic film covers at least an upper surface of the molded resin. The metal film covers the magnetic film and the molded resin.

The electronic component (electronic circuit package) disclosed in Japanese Patent No. 5988004 includes, as in the electronic component disclosed in Japanese Patent No. 5988003, a substrate, a plurality of surface mount devices, a molded resin, and a metal film covering the molded resin. A basic structure of the electronic component disclosed in Japanese Patent No. 5988004 is similar to that of the electronic component disclosed in Japanese Patent No. 5988003. In the electronic component disclosed in Japanese Patent No. 5988004, a magnetic film is further disposed on a surface of a portion of the metal film, the portion being positioned close to an IC chip that tends to be affected by noise.

With the structures disclosed in Japanese Unexamined Patent Application Publication No. 2011-77430, Japanese Patent No. 5988003 and Japanese Patent No. 5988004, however, noise generated from the surface mount device cannot be effectively reduced or prevented in some cases.

More specifically, the noise generated from the surface mount device includes a high frequency component (high frequency noise) and a low frequency component (low frequency noise). Of those two types of noises, the low frequency noise tends to propagate through the metal film defining a metal shield layer.

In the structure disclosed in Japanese Unexamined Patent Application Publication No. 2011-77430, because the metal film defining the metal shield layer is disposed on the outermost layer, the low frequency noise reaching the metal film is radiated. In particular, the low frequency noise is radiated from an edge portion where a current in the metal film in the outermost layer tends to concentrate.

In the structures disclosed in Japanese Patent No. 5988003 and Japanese Patent No. 5988004, a ground terminal of the surface mount device is connected to a ground conductor of a base circuit substrate. Accordingly, the ground terminal of the surface mount device and the metal film may be connected to each other through the ground conductor of the base circuit substrate in some cases. In such a case, the low frequency noise generated from the surface mount device is propagated to the metal film through the ground conductor of the base circuit substrate and is radiated to the outside from the edge portion of the metal film. In particular, the low frequency noise flowing through the ground conductor of the base circuit substrate tends to have a large magnitude, and the low frequency noise having the large magnitude is radiated to the outside.

SUMMARY OF THE INVENTION

Preferred embodiments of the present invention provide structures that effectively reduce or prevent radiation of low frequency noise from an electronic component.

A preferred embodiment of the present invention provides an electronic component including a thin-film shield layer, the electronic component including a wiring substrate, one or more surface mount devices mounted to a first principal surface of the wiring substrate, a metal thin-film shield layer, and a magnetic metal thin-film shield layer. The metal thin-film shield layer is formed by a thin-film process using a nonmagnetic metal material and entirely or substantially entirely covers the surface mount devices at the top surface side and the lateral surface side thereof. The metal thin-film shield layer includes a top surface portion and a lateral surface portion. The magnetic metal thin-film shield layer is formed by a thin-film process using a magnetic metal material and covers the top surface portion and the lateral surface portion of the metal thin-film shield layer, including an entire or substantially an entire edge portion at which the top surface portion and the lateral surface portion are joined to each other.

With the above-described features, since the edge portion of the metal thin-film shield layer is entirely or substantially entirely covered with the magnetic metal thin-film shield, it is possible to reduce or prevent radiation of the low frequency noise to the outside from a region from which the low frequency noise tends to be radiated. Radiation of the high frequency noise to the outside is reduced or prevented by the metal thin-film shield layer.

In an electronic component including a thin-film shield layer according to a preferred embodiment the present invention, preferably, a sealing resin layer covers the surface mount devices, and the metal thin-film shield layer is disposed on the outer side of the sealing resin layer.

With the above-described features, the surface mount devices are protected by the sealing resin layer. Furthermore, the metal thin-film shield layer is able to easily be provided.

In an electronic component including a thin-film shield layer according to a preferred embodiment of the present invention, preferably, the top surface portion and the lateral surface portion of the metal thin-film shield layer are in contact with the magnetic metal thin-film shield layer.

With the above-described feature, adhesion between the metal thin-film shield layer and the magnetic metal thin-film shield layer is increased, and reliability is improved.

In an electronic component including a thin-film shield layer according to a preferred embodiment of the present invention, preferably, the wiring substrate includes a ground electrode, and the metal thin-film shield layer is connected to the ground electrode.

With the above-described features, the high frequency noise is efficiently guided from the metal thin-film shield layer to the ground.

In an electronic component including a thin-film shield layer according to a preferred embodiment of the present invention, preferably, the wiring substrate is a magnetic substrate including a magnetic layer.

With the above-described feature, a closed magnetic circuit is defined by the magnetic metal thin-film shield layer and the magnetic substrate, and an effect of reducing or preventing the radiation of the low frequency noise is increased.

In an electronic component including a thin-film shield layer according to a preferred embodiment of the present invention, the electronic component preferably further includes a resin layer containing a magnetic material, the resin layer entirely or substantially entirely covering the surface mount devices at the top surface side and the lateral surface side thereof.

With the above-described feature, the effect of reducing or preventing the radiation of the low frequency noise is further increased.

In an electronic component including a thin-film shield layer according to a preferred embodiment of the present invention, when looking at the top surface portion of the metal thin-film shield layer in plan view, the metal thin-film shield layer preferably includes an opening in a region overlapping with at least one of the surface mount devices.

With the above-described feature, a structure matched with frequency characteristics of the low frequency noise and the high frequency noise is obtained, and the effect of reducing or preventing the radiation of the low frequency noise and the high frequency noise is further increased.

In an electronic component including a thin-film shield layer according to a preferred embodiment of the present invention, the magnetic thin-film shield layer preferably entirely or substantially entirely covers a portion of the plurality of surface mount devices at the top surface side and the lateral surface side thereof.

With the above-described feature, the optimum shielding effect is able to be obtained depending on module configurations of the surface mount devices and the type of the electronic component, and the effect of reducing or preventing the radiation of the low frequency noise and the high frequency noise is further increased.

In an electronic component including a thin-film shield layer according to a preferred embodiment of the present invention, the edge portion of the metal thin-film shield layer preferably has a curvature in a portion thereof.

With the above-described feature, a structure to moderate concentration of a current to the edge portion and to reduce or prevent the radiation of the noise from the edge portion is obtained. Thus, the effect of reducing or preventing the radiation of the noise is further increased.

According to preferred embodiments of the present invention, the radiation of the low frequency noise from the electronic component is able to be effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

Figure 1:
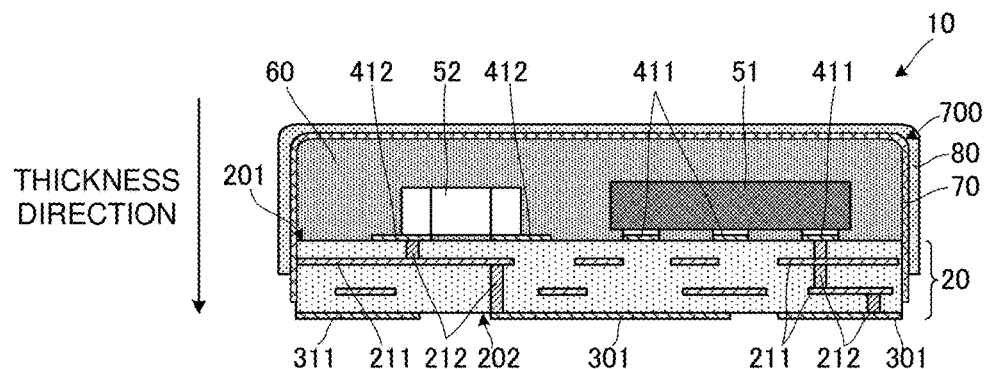
FIG. 1 is a side sectional view of an electronic component including a thin-film shield layer according to a first preferred embodiment of the present invention.

An electronic component including a thin-film shield layer according to a first preferred embodiment of the present invention will be described below with reference to the drawings. FIG. 1 is a side sectional view of the electronic component including the thin-film shield layer according to the first preferred embodiment of the present invention. It is to be noted that, in FIG. 1, reference signs for identifying elements are omitted as appropriate for easier recognition of a structure of the electronic component.

As illustrated in FIG. 1, the electronic component 10 including the thin-film shield layer includes a wiring substrate 20, surface mount devices 51 and 52, a sealing resin layer 60, a metal thin-film shield layer 70, and a magnetic metal thin-film shield layer 80.

The wiring substrate 20 preferably has a shape (e.g., a flat plate shape) including a first principal surface 201 and a second principal surface 202 that are opposed to each other. The wiring substrate 20 includes a lateral surface connecting the first principal surface 201 and the second principal surface 202 to each other. The wiring substrate 20 is, for example, a glass epoxy substrate.

Conductor patterns 211 and interlayer connection conductors 212 are provided in the wiring substrate 20. Each of the conductor patterns 211 extends in a direction perpendicular or substantially perpendicular to a thickness direction, and each of the interlayer connection conductors 212 extends in a direction parallel or substantially parallel to the thickness direction. A portion of the conductor patterns 211 is exposed at the lateral surface of the wiring substrate 20.

Device land conductors 411 and 412 are provided on the first principal surface 201 of the wiring substrate 20. A ground terminal conductor 301 and an external connection terminal conductor 311 are provided on the second principal surface 202 of the wiring substrate 20.

The device land conductors 411 and 412 are connected to the ground terminal conductor 301 and the external connection terminal conductor 311 through the conductor patterns 211 and the interlayer connection conductors 212 in accordance with a predetermined circuit pattern. With this structure, a circuit to be provided in the wiring substrate 20 is obtained.

The surface mount device 51 is mounted to the device land conductors 411, and the surface mount device 52 is mounted to the device land conductors 412. Thus, the surface mount devices 51 and 52 are mounted to the first principal surface 201 of the wiring substrate 20. The surface mount device 51 is preferably, for example, an IC chip, and the surface mount device 52 is preferably, for example, a chip capacitor.

The sealing resin layer 60 covers the surface mount devices 51 and 52 and the first principal surface 201. A lateral surface of the sealing resin layer 60 is flush or substantially flush with that of the wiring substrate 20. The sealing resin layer 60 is preferably made of an epoxy resin, for example. The sealing resin layer 60 preferably contains nonmetal filler such as alumina or silica, for example, but it does not contain magnetic metal filler or nonmagnetic metal filler.

The metal thin-film shield layer 70 entirely or substantially entirely covers a top surface and a lateral surface of the sealing resin layer 60. In other words, the metal thin-film shield layer 70 covers the outer side of the sealing resin layer 60 and entirely or substantially entirely covers the surface mount devices 51 and 52 at the top surface side and the lateral surface side thereof. Furthermore, the metal thin-film shield layer 70 covers the lateral surface of the wiring substrate 20 up to an intermediate position along the thickness direction. Thus, the metal thin-film shield layer 70 covers not only the entire or substantially the entire lateral surface of the sealing resin layer 60, but also a region of the lateral surface of the wiring substrate 20 on the side closer to the first principal surface 201.

The metal thin-film shield layer 70 is formed by a thin-film process such as sputtering, for example, and thus has high adhesion. The metal thin-film shield layer 70 preferably includes three layers laminated in the order of SUS, Cu, and SUS, for example. A thickness of the metal thin-film shield layer 70 is preferably about 3 μm to 5 μm, for example.

The metal thin-film shield layer 70 is connected to the conductor patterns 211 exposed at the lateral surface of the wiring substrate 20. The metal thin-film shield layer 70 is thus connected to the ground terminal conductor 301.

An edge portion at which the top surface and the lateral surface of the sealing resin layer 60 are joined to each other is preferably chamfered into a round shape, i.e., into a rounded corner. Thus, the edge portion has a curvature in a portion thereof. Because the edge portion of the sealing resin layer 60 is chamfered into the round shape, an edge portion 700 at which a top surface and a lateral surface of the metal thin-film shield layer 70 formed by the thin-film process, such as sputtering, are joined to each other also has a round shape. Accordingly, concentration of a current to the edge portion 700 of the metal thin-film shield layer 70 is moderated, and radiation of noise from the edge portion 700 is able to be reduced or prevented.

The magnetic metal thin-film shield layer 80 covers the entire or substantially the entire top surface and the lateral surface of the metal thin-film shield layer 70, including the edge portion 700. The magnetic metal thin-film shield layer 80 further covers the lateral surface of the wiring substrate 20 up to an intermediate position along the thickness direction. The magnetic metal thin-film shield layer 80 is preferably made of a nickel-based alloy, such as Permalloy, for example. The magnetic metal thin-film shield layer 80 is preferably as thin as possible within a range in which the desired effect of shielding the low frequency noise is obtained.

In the electronic component 10 including the thin-film shield layer, the metal thin-film shield layer 70 reduces or prevents radiation of the high frequency noise, which is generated from the surface mount devices, to the outside, and the magnetic metal thin-film shield layer 80 reduces or prevents radiation of the low frequency noise to the outside. In addition, because of the edge portion 700 of the metal thin-film shield layer 70 being covered with the magnetic metal thin-film shield layer, even when the low frequency noise is propagated to the metal thin-film shield layer 70 and is radiated from the edge portion 700 from which the low frequency noise tends to be radiated, the radiation of the low frequency noise to the outside is able to be reduced or prevented by the magnetic metal thin-film shield layer 80.

Furthermore, since the metal thin-film shield layer 70 and the magnetic metal thin-film shield layer 80 are thin films, a thickness of the electronic component 10 including the thin-film shield layer is able to be reduced. In addition, since the metal thin-film shield layer 70 and the magnetic metal thin-film shield layer 80 are thin films, they have high adhesion. Thus, reliability is improved. Since the thin films are each a denser thin film than a composite film, such as a resin layer mixed with metal filler or a resin layer mixed with magnetic metal filler, an ability of reducing or preventing the low frequency noise is able to be increased.

Second Preferred Embodiment

Figure 2:
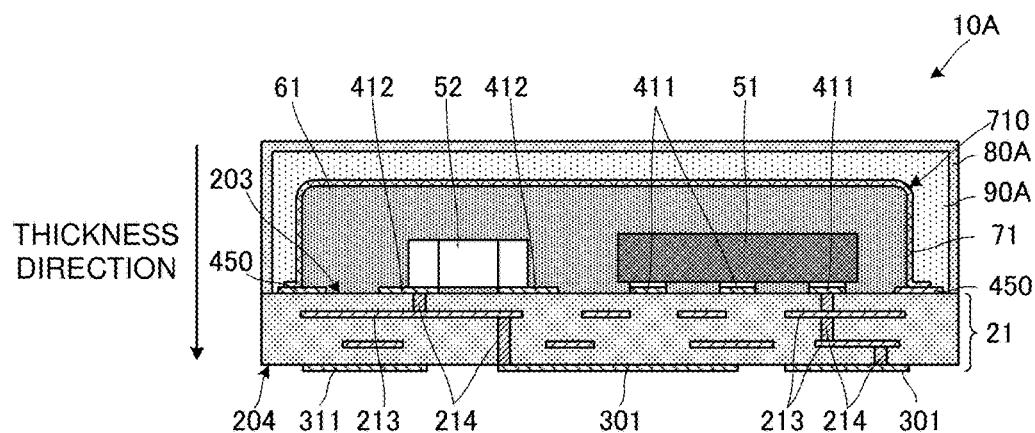
FIG. 2 is a side sectional view of an electronic component including a thin-film shield layer according to a second preferred embodiment of the present invention.

An electronic component including a thin-film shield layer according to a second preferred embodiment of the present invention will be described below with reference to the drawings. FIG. 2 is a side sectional view of the electronic component including the thin-film shield layer according to the second preferred embodiment of the present invention. It is to be noted that, in FIG. 2, reference signs identifying elements are omitted as appropriate for easier recognition of a structure of the electronic component.

As illustrated in FIG. 2, the electronic component including the thin-film shield layer according to the second preferred embodiment is different from the electronic component 10 including the thin-film shield layer according to the first preferred embodiment in features with respect to a wiring substrate 21, a sealing resin layer 61, a metal thin-film shield layer 71, a magnetic metal thin-film shield layer 80A, a magnetic shield layer 90A, and metal-shield land conductors 450. Other elements of the electronic component 10A including the thin-film shield layer are the same as or similar to those in the electronic component 10 including the thin-film shield layer, and description of the same or similar elements is omitted. The wiring substrate 21 is preferably, for example, a magnetic multilayer substrate. More specifically, the wiring substrate 21 is preferably an LTCC multilayer substrate made of ferrite ceramic, for example. The sealing resin layer 61 corresponds to the sealing resin layer 60, and the metal thin-film shield layer 71 corresponds to the metal thin-film shield layer 70.

The wiring substrate 21 has a shape (e.g., a flat plate shape) including a first principal surface 203 and a second principal surface 204 that are opposed to each other. The wiring substrate 21 includes a lateral surface connecting the first principal surface 203 and the second principal surface 204 to each other.

Conductor patterns 213 and interlayer connection conductors 214 are provided in the wiring substrate 21. Each of the conductor patterns 213 extends in a direction perpendicular or substantially perpendicular to a thickness direction, and each of the interlayer connection conductors 214 extends in a direction parallel or substantially parallel to the thickness direction.

The device land conductors 411 and 412 and the metal-shield land conductors 450 are provided on the first principal surface 203 of the wiring substrate 21. The ground terminal conductor 301 and the external connection terminal conductor 311 are provided on the second principal surface 204 of the wiring substrate 21.

The device land conductors 411 and 412 are connected to the ground terminal conductor 301 and the external connection terminal conductor 311 through the conductor patterns 213 and the interlayer connection conductors 214 in accordance with a predetermined circuit pattern. With such a structure, a circuit to be provided in the wiring substrate 21 is obtained.

The metal-shield land conductors 450 are provided on the first principal surface 203. Looking at the first principal surface 203 in plan view, the device land conductors 411 and 412 are provided in a region surrounded by the metal-shield land conductor 450.

The metal thin-film shield layer 71 entirely or substantially entirely covers the sealing resin layer 61 and is connected to the metal-shield land conductors 450. The metal-shield land conductors 450 are connected to a not-illustrated ground of the electronic component 10A with the thin-film shield layer. Therefore, the high frequency noise propagated to the metal thin-film shield layer 71 is able to be efficiently guided to the ground of the electronic component 10A with the thin-film shield layer.

An edge portion at which a top surface and a lateral surface of the sealing resin layer 61 are joined to each other is preferably chamfered into a round shape. Thus, a portion of the edge portion has a curvature. Because the edge portion of the sealing resin layer 61 is chamfered into the round shape, an edge portion 710 at which a top surface and a lateral surface of the metal thin-film shield layer 71 formed by a thin-film process, such as sputtering, for example, are joined to each other also has a round shape. Accordingly, concentration of a current to the edge portion 710 of the metal thin-film shield layer 71 is moderated.

The magnetic shield layer 90A covers all of the metal thin-film shield layer 71, the sealing resin layer 61, and the first principal surface 203 of the wiring substrate 21. When looking at the wiring substrate 21 in plan view, the magnetic shield layer 90A further covers portions of the metal-shield land conductors 450, the portions projecting outward of the metal thin-film shield layer 71. The magnetic shield layer 90A is preferably made of, for example, a resin containing magnetic powder (i.e., a magnetic powder-containing resin).

The magnetic metal thin-film shield layer 80A covers the magnetic shield layer 90A, the metal thin-film shield layer 71, the sealing resin layer 61, and the first principal surface 203 of the wiring substrate 21. The magnetic metal thin-film shield layer 80A is preferably made of a nickel-based alloy, such as Permalloy, for example. The magnetic metal thin-film shield layer 80A is preferably as thin as possible within a range in which the desired effect of shielding the low frequency noise is obtained.

In the electronic component 10A including the thin-film shield layer, the metal thin-film shield layer 71 reduces or prevents radiation of the high frequency noise, which is generated from the surface mount devices, to the outside, while the magnetic shield layer 90A and the magnetic metal thin-film shield layer 80A reduce or prevent radiation of the low frequency noise to the outside. In addition, because of the edge portion 710 of the metal thin-film shield layer 71 being covered with the magnetic shield layer 90A and the magnetic metal thin-film shield layer 80A, even when the low frequency noise is propagated to the metal thin-film shield layer 71 and is radiated from the edge portion 710 from which the low frequency noise tends to be radiated, the radiation of the low frequency noise to the outside is able to be reduced or prevented by the magnetic shield layer 90A and the magnetic metal thin-film shield layer 80A.

Furthermore, since the metal thin-film shield layer 71 and the magnetic metal thin-film shield layer 80A are thin films, a thickness of the electronic component 10A including the thin-film shield layer is able to be reduced. In addition, since the metal thin-film shield layer 71 and the magnetic metal thin-film shield layer 80A are thin films, they have high adhesion. Thus, reliability is improved.

When, as described above, the resin containing magnetic powder (i.e., the magnetic powder-containing resin) is used as the magnetic shield layer 90A in the second preferred embodiment of the present invention, the electronic component 10A including the thin-film shield layer is able to be provided in a magnetically closed state with respect to the surface mount devices 51 and 52.

Figure 3:
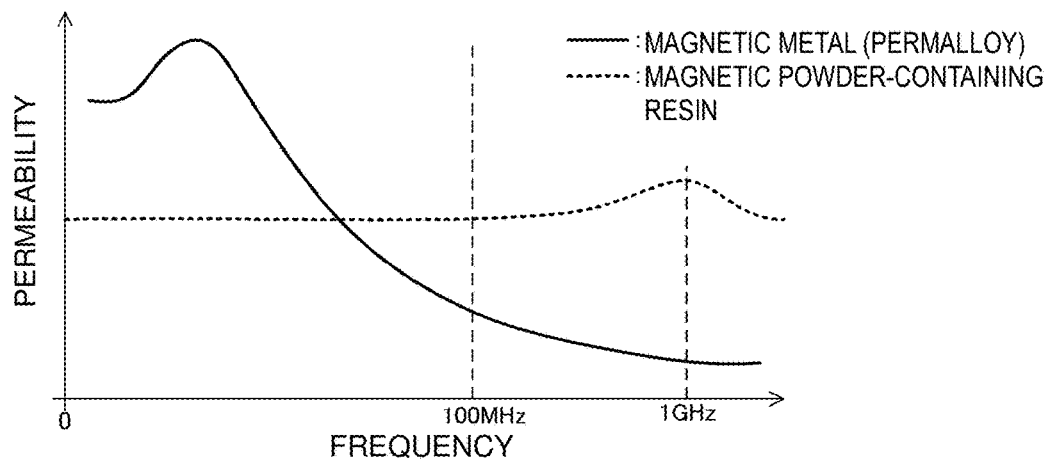
FIG. 3 is a graph depicting frequency characteristics of permeability of a magnetic metal (Permalloy) and a magnetic powder-containing resin.

FIG. 3 is a graph depicting frequency characteristics of permeability of a magnetic metal (Permalloy) and a magnetic powder-containing resin. In FIG. 3, a frequency band lower than about 100 MHz is a low frequency region, and a frequency band higher than about 100 MHz is a high frequency region. A threshold between the high frequency region and the low frequency region is not limited to about 100 MHz, and it may be set to about several hundred MHz.

In the case of a power supply circuit, for example, the threshold is set on the basis of a switching frequency of a switching IC of the power supply circuit.

As illustrated in FIG. 3, the permeability of the magnetic metal (Permalloy) is very high at very low frequencies, for example, about 10 Hz to about 100 Hz, and it starts to reduce from a comparatively low frequency as the frequency increases. On the other hand, the permeability of the magnetic powder-containing resin exhibits a small variation depending on frequency and is substantially constant in both of the very low frequency region and the high frequency region. In the low frequency region, the permeability of the magnetic powder-containing resin is lower than that of the magnetic metal, but it becomes higher than that of the magnetic metal near about 100 MHz.

Stated in another way, although it is not easy to obtain a high shielding rate over the entire low frequency noise, i.e., a whole band up to about 100 MHz, only with the magnetic metal (Permalloy), the ability of shielding the low frequency region is increased over a wider frequency band and the radiation of the low frequency noise is able to be reduced or prevented by combining the magnetic metal with the magnetic shield layer 90A that is made of the magnetic powder-containing resin.

Moreover, in the electronic component 10A including the thin-film shield layer, the magnetic metal thin-film shield layer 80A is preferably made of the magnetic metal (Permalloy), for example. Accordingly, the low frequency noise in very low frequencies, radiated from the surface mount devices 51 and 52, is able to be effectively shielded by the magnetic metal thin-film shield layer 80A.

As a result, the electronic component 10A including the thin-film shield layer is able to effectively reduce or prevent the radiation of the noise to the outside without depending on the frequency of the noise.

The magnetic shield layer 90A may be made of a non-magnetic material. In this case, a parasitic inductance component is able to be reduced because the metal thin-film shield layer 71 is not in contact with any magnetic material.

Third Preferred Embodiment

Figure 4:
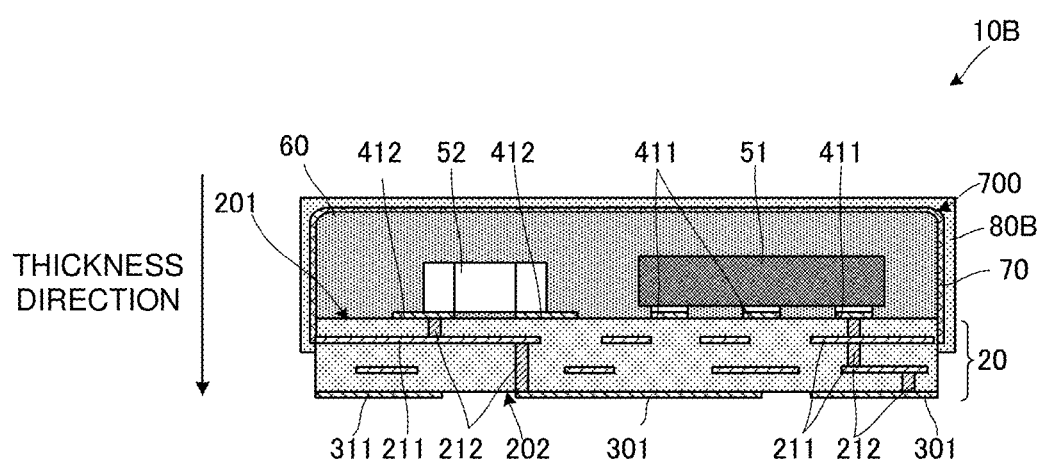
FIG. 4 is a side sectional view of an electronic component including a thin-film shield layer according to a third preferred embodiment of the present invention.

An electronic component including a thin-film shield layer according to a third preferred embodiment of the present invention will be described below with reference to the drawing. FIG. 4 is a side sectional view of the electronic component including the thin-film shield layer according to the third preferred embodiment of the present invention. It is to be noted that, in FIG. 4, reference signs for elements are omitted as appropriate for easier recognition of a structure of the electronic component.

As illustrated in FIG. 4, the electronic component 10B including the thin-film shield layer according to the third preferred embodiment is different from the electronic component 10 including the thin-film shield layer according to the first preferred embodiment in feature with respect to a magnetic metal thin-film shield layer 80B. Other elements of the electronic component 10B including the thin-film shield layer are the same as or similar to those in the electronic component 10 including the thin-film shield layer, and description of the same or similar elements is omitted.

The magnetic metal thin-film shield layer 80B covers not only the entirety or substantially the entirety of both the top surface and the lateral surface of the metal thin-film shield layer 70, including the edge portion 700 at which the top surface and the lateral surface of the metal thin-film shield layer 70 are joined to each other, but also an end surface defined by an end portion of the lateral surface of the metal thin-film shield layer 70. In other words, the magnetic metal thin-film shield layer 80B completely covers the metal thin-film shield layer 70.

In the electronic component 10B including the thin-film shield layer, the metal thin-film shield layer 70 reduces or prevents radiation of the high frequency noise, which is generated from the surface mount devices, to the outside, and the magnetic metal thin-film shield layer 80B reduces or prevents radiation of the low frequency noise to the outside. In addition, because of the metal thin-film shield layer 70 being completely covered with the magnetic metal thin-film shield layer 80B, even when the low frequency noise is propagated to the metal thin-film shield layer 70, the effect of reducing or preventing the low frequency noise is able to be improved.

Fourth Preferred Embodiment

Figure 5:
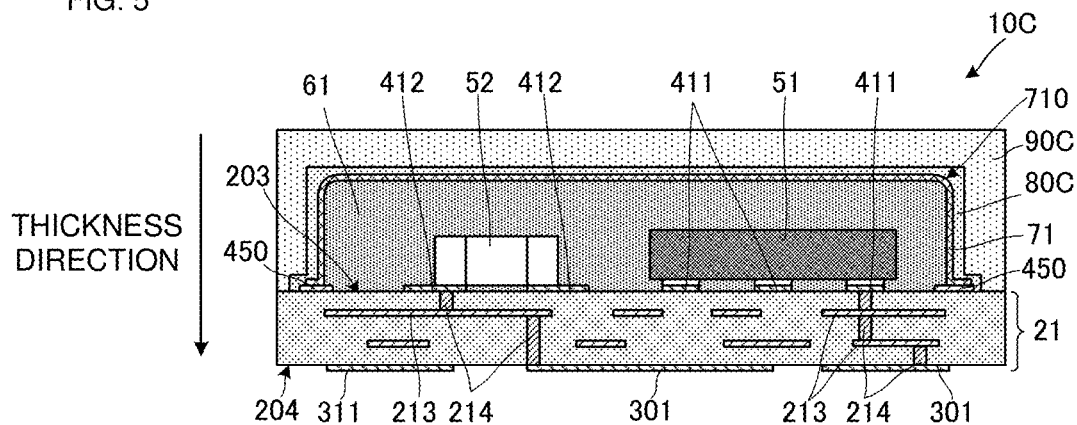
FIG. 5 is a side sectional view of an electronic component including a thin-film shield layer according to a fourth preferred embodiment of the present invention.

An electronic component including a thin-film shield layer according to a fourth preferred embodiment of the present invention will be described below with reference to the drawing. FIG. 5 is a side sectional view of the electronic component including the thin-film shield layer according to the fourth preferred embodiment of the present invention. It is to be noted that, in FIG. 5, reference signs for elements are omitted as appropriate for easier recognition of a structure of the electronic component.

As illustrated in FIG. 5, the electronic component 10C including the thin-film shield layer according to the fourth preferred embodiment is different from the electronic component 10A including the thin-film shield layer according to the second preferred embodiment in features with respect to a magnetic metal thin-film shield layer 80C and a magnetic shield layer 90C. More specifically, the electronic component 10C including the thin-film shield layer has a structure resulting from reversing the order in which the magnetic metal thin-film shield layer 80A and the magnetic shield layer 90A are laminated in the electronic component 10A with the thin-film shield layer according to the second preferred embodiment. Other elements of the electronic component 10C including the thin-film shield layer are the same as or similar to those in the electronic component 10A with the thin-film shield layer, and description of the same or similar elements is omitted.

The magnetic metal thin-film shield layer 80C covers the metal thin-film shield layer 71, the sealing resin layer 61, the metal-shield land conductors 450, and the first principal surface 203 of the wiring substrate 21. When looking at the wiring substrate 21 in plan view, the magnetic metal thin-film shield layer 80C further covers portions of the metal-shield land conductors 450 projecting outward of the metal thin-film shield layer 71. The magnetic metal thin-film shield layer 80C is preferably made of a nickel-based alloy such as Permalloy, for example. The magnetic metal thin-film shield layer 80C is preferably as thin as possible within a range in which the desired effect of shielding the low frequency noise is obtained.

The magnetic shield layer 90C covers all of the magnetic metal thin-film shield layer 80C, the metal thin-film shield layer 71, the sealing resin layer 61, the metal-shield land conductors 450, and the first principal surface 203 of the wiring substrate 21. The magnetic shield layer 90C is preferably made of, for example, a resin containing magnetic powder (i.e., a magnetic powder-containing resin).

In the electronic component 10C including the thin-film shield layer, the metal thin-film shield layer 71 reduces or prevents radiation of the high frequency noise, which is generated from the surface mount devices, to the outside, and the magnetic metal thin-film shield layer 80C and the magnetic shield layer 90C reduce or prevent radiation of the low frequency noise to the outside. In addition, because of the edge portion 710 of the metal thin-film shield layer 71 being covered with the magnetic metal thin-film shield layer 80C and the magnetic shield layer 90C, even when the low frequency noise is propagated to the metal thin-film shield layer 71 and is radiated from the edge portion 710 from which the low frequency noise tends to be radiated, the radiation of the low frequency noise to the outside is able to be reduced or prevented by the magnetic metal thin-film shield layer 80C and the magnetic shield layer 90C.

Thus, the above-described structure can also provide similar advantageous effects to those obtained in the second preferred embodiment. In addition, since the metal thin-film shield layer 71 and the magnetic metal thin-film shield layer 80C are each formed by the thin-film process, those layers are able to be easily formed and have high adhesion.

Fifth Preferred Embodiment

Figure 6A:
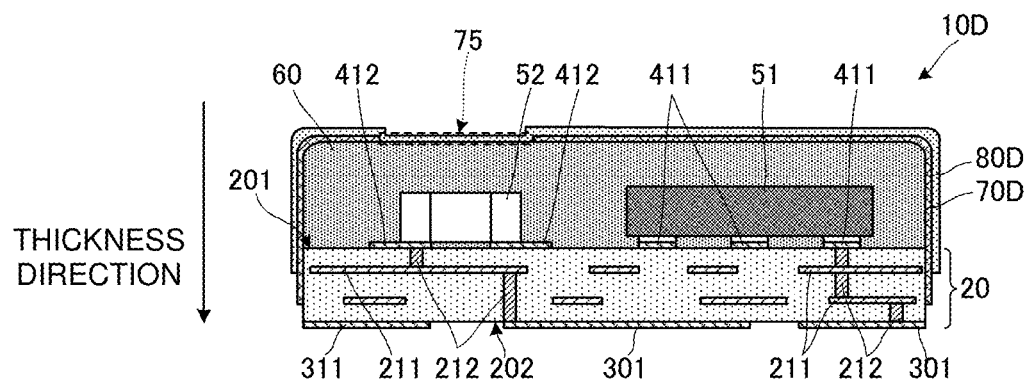
FIGS. 6A and 6B are each a side sectional view of an electronic component including a thin-film shield layer according to a fifth preferred embodiment of the present invention.
Figure 6B:
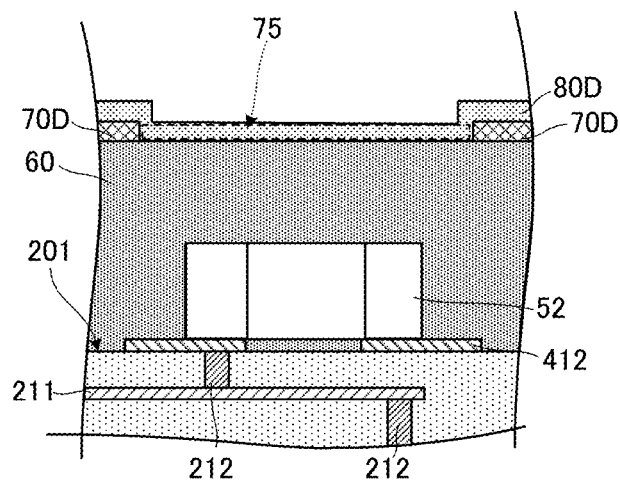
Figure 6C:
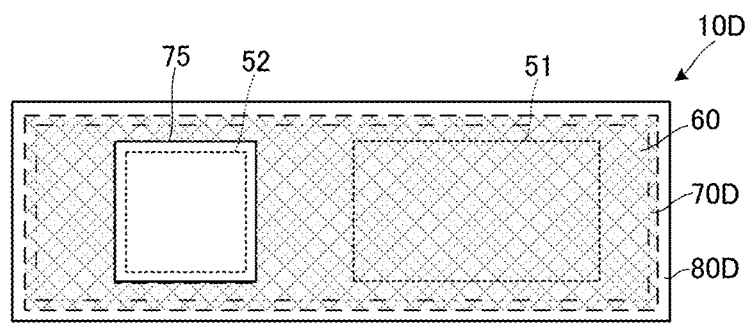
FIG. 6C is a schematic view when looking at the electronic component including the thin-film shield layer according to the fifth preferred embodiment of the present invention in plan.

An electronic component including a thin-film shield layer according to a fifth preferred embodiment of the present invention will be described below with reference to the drawings. FIG. 6A is a side sectional view of the electronic component including the thin-film shield layer according to the fifth preferred embodiment of the present invention. FIG. 6B is an enlarged view of a portion of the side sectional view illustrated in FIG. 6A. FIG. 6C is a plan view when looking at the electronic component 10D with the thin-film shield layer from the side facing the first principal surface 201, namely from the thickness direction.

It is to be noted that, in FIGS. 6A to 6C, reference signs for elements are omitted as appropriate for easier recognition of a structure of the electronic component. In FIG. 6C, a portion of the elements is illustrated without hatching for easier understanding of the structure.

In the present preferred embodiment, it is assumed that the surface mount device 51 is an electronic device, such as an IC chip, generating both the low frequency noise and the high frequency noise, and that the surface mount device 52 is an electronic device, such as a closed magnetic circuit coil, generating the low frequency noise.

As illustrated in FIGS. 6A and 6B, the electronic component including the thin-film shield layer according to the fifth preferred embodiment is different from the electronic component 10 including the thin-film shield layer according to the first preferred embodiment in features with respect to a metal thin-film shield layer 70D and a magnetic metal thin-film shield layer 80D. Other elements of the electronic component 10D including the thin-film shield layer are the same as or similar to those in the electronic component 10 including the thin-film shield layer, and description of the same or similar elements is omitted.

As illustrated in FIG. 6A, the metal thin-film shield layer 70D includes an opening 75. The magnetic metal thin-film shield layer 80D covers the opening 75.

As illustrated in FIG. 6B that is an enlarged view of a portion of the side sectional view illustrated in FIG. 6A, the opening 75 is provided in the metal thin-film shield layer 70D at a position opposing to the surface mount device 52. The magnetic metal thin-film shield layer 80D covers the opening 75 of the metal thin-film shield layer 70D. In other words, the magnetic metal thin-film shield layer 80D fills the opening 75, and only the magnetic metal thin-film shield layer 80D is provided above a first principal surface 201 (top surface) of the wiring substrate 20.

Furthermore, as illustrated in FIG. 6C, the opening 75 spans over the entire or substantially the entire surface of the surface mount device 52.

With the above-described structure, the low frequency noise and the high frequency noise both generated from the surface mount device 51 are reduced or prevented by the metal thin-film shield layer 70D and the magnetic metal thin-film shield layer 80D. The low frequency noise generated from the surface mount device 52 is reduced or prevented by the magnetic metal thin-film shield layer 80D.

Stated in another way, it is possible to efficiently reduce or prevent the low frequency noise and the high frequency noise generated from the surface mount devices 51 and 52 in a manner adapted for each device.

Furthermore, because of the structure in which the top surface of the surface mount device 52 defined as the coil and the metal thin-film shield layer 70D are not opposed to each other, an advantageous effect of not deteriorating a Q-value of the coil is obtained. Moreover, a similar advantageous effect is obtained regardless of whether a winding direction of the surface mount device 52 defined as the coil is parallel or perpendicular to the first principal surface 201.

A shape of the opening 75 is required to have at least the same or substantially the same size as the surface mount device 52 when viewed in plan. The shape of the opening 75 is preferably larger than the surface mount device 52 so as to protrude from each lateral surface by about 10%, for example, when viewed in plan. Although the opening 75 is, for example, rectangular or substantially rectangular in the present preferred embodiment, the shape of the opening 75 is not limited to such an example. The opening 75 may have a triangular, polygonal, or any other suitable shape, such as an L-shape other than the rectangular shape.

Sixth Preferred Embodiment

Figure 7A:
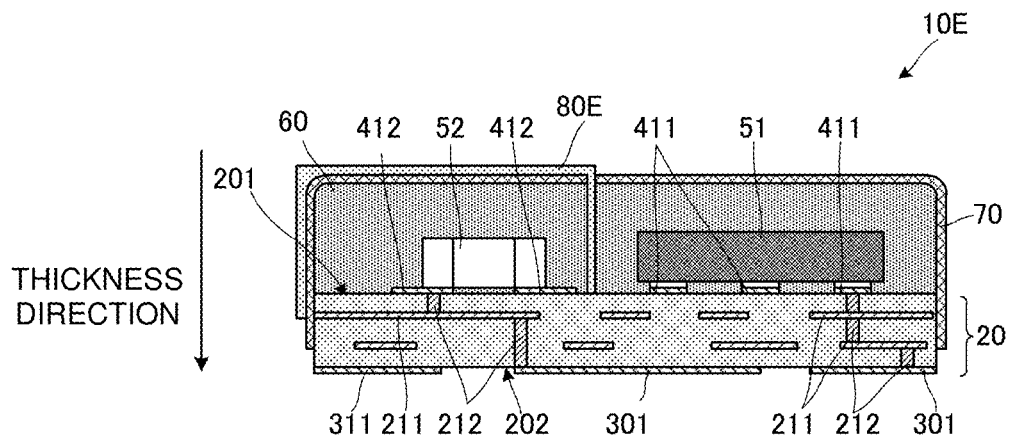
FIG. 7A is a side sectional view of an electronic component including a thin-film shield layer according to a sixth preferred embodiment of the present invention.
Figure 7B:
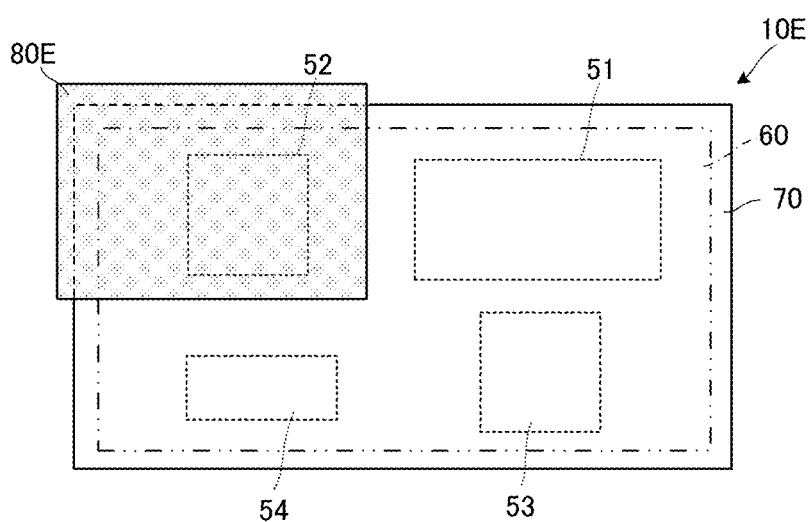
FIG. 7B is a schematic view when looking at the electronic component including the thin-film shield layer according to the sixth preferred embodiment of the present invention in plan.
Figure 7C:
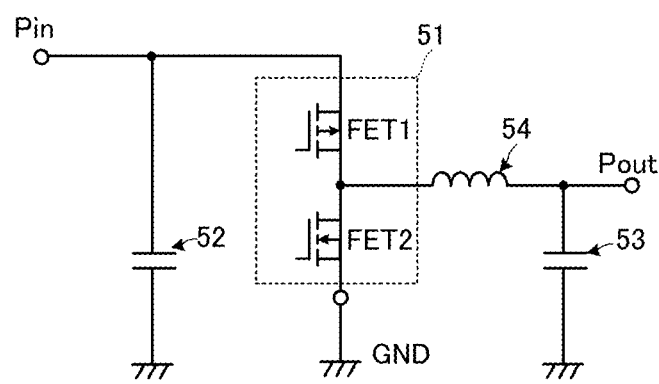
FIG. 7C is a circuit diagram of the electronic component including the thin-film shield layer according to the sixth preferred embodiment of the present invention.

An electronic component including a thin-film shield layer according to a sixth preferred embodiment of the present invention will be described below with reference to the drawings. FIG. 7A is a side sectional view of the electronic component including the thin-film shield layer according to the sixth preferred embodiment of the present invention. FIG. 7B is a plan view when looking at the electronic component including the thin-film shield layer from the thickness direction, namely from the side facing a top surface of the electronic component. FIG. 7C is a circuit diagram of the electronic component including the thin-film shield layer.

It is to be noted that, in FIGS. 7A and 7B, reference signs for elements are omitted as appropriate for easier recognition of a structure of the electronic component. In FIG. 7B, a portion of the elements is illustrated without hatching for easier understanding of the structure.

As illustrated in FIGS. 7A to 7C, the electronic component including the thin-film shield layer according to the sixth preferred embodiment is different from the electronic component 10 including the thin-film shield layer according to the first preferred embodiment in including surface mount devices 53 and 54, and in feature with respect to a magnetic metal thin-film shield layer 80E. Other elements of the electronic component 10E including the thin-film shield layer are the same as or similar to those in the electronic component 10 including the thin-film shield layer, and description of the same or similar elements is omitted.

The electronic component 10E including the thin-film shield layer, illustrated in FIGS. 7A to 7C, is a step-down DC-DC converter module.

As illustrated in FIGS. 7A and 7B, the electronic component 10E including the thin-film shield layer includes the surface mount devices 51, 52, 53 and 54, and the magnetic metal thin-film shield layer 80E. For example, preferably, the surface mount device 51 is an IC chip, the surface mount device 52 is an input capacitor, the surface mount device 53 is an output capacitor, and the surface mount device 54 is a closed magnetic circuit choke-coil.

As illustrated in FIG. 7A, the magnetic metal thin-film shield layer 80E surrounds the top surface and the entire or substantially the entire lateral surface of the surface mount device 52. Furthermore, the metal thin-film shield layer 70 and the magnetic metal thin-film shield layer 80E cover the top surface of the surface mount device 52 and a portion of the lateral surface of the surface mount device 52, the portion being positioned close to a lateral surface of the electronic component 10E with the thin-film shield layer.

FIG. 7B is a plan view when looking at the structure illustrated in FIG. 7A in the thickness direction from the top surface side, and it illustrates that the magnetic metal thin-film shield layer 80E covers the top surface and the entire or substantially the entire lateral surface of the surface mount device 52.

FIG. 7C is a circuit diagram of the electronic component 10E including the thin-film shield layer. The surface mount device 51, which is the IC chip, includes a field effect transistor FET1 and a field effect transistor FET2. The surface mount device 51 and the surface mount device 52 are connected to an input terminal Pin. The surface mount device 51 is connected to one end of the surface mount device 54, and an output terminal Pout and the surface mount device 53 are connected to the other end of the surface mount device 55. The surface mount devices 51, 52 and 53 are connected to a ground GND.

With the above-described circuit, an input voltage applied to the input terminal Pin is stepped down and output from the output terminal Pout by turning ON and OFF the field effect transistors FET1 and FET2 of the surface mount device 51.

The input voltage at the input terminal Pin is higher than an output voltage at the output terminal Pout. In other words, the surface mount device 52, which is the input capacitor, is more apt to generate noise than the surface mount device 53 that is the output capacitor.

Thus, the noise is able to be effectively reduced or prevented by covering the entire or substantially the entire lateral surface and the top surface of the surface mount device 52 with the magnetic metal thin-film shield layer 80E.

With the above-described structure, the low frequency noise and the high frequency noise both generated from the surface mount device 52 are reduced or prevented by the metal thin-film shield layer 70 and the magnetic metal thin-film shield layer 80E.

Furthermore, the effect of shielding the low frequency noise and the high frequency noise generated from the surface mount devices 51 and 52 is able to be efficiently increased by selecting the metal thin-film shield layer 70 or the magnetic metal thin-film shield layer 80E to match the characteristics of the generated noises.

Alternatively, the surface mount devices 51 and 52 may be individually surrounded by separate sealing resin layers, and the sealing resin layers may each be surrounded by either one or both of the metal thin-film shield layer 70 and the magnetic metal thin-film shield layer 80E. Such a structure enables shields to match with the characteristics of the low frequency noise and the high frequency noise generated from the surface mount devices 51 and 52. As a result, the shielding effect is able to be increased with the above structure. In the above case, the shields may each be configured so as not to overlap with the lateral surface of the wiring substrate 20.

Seventh Preferred Embodiment

Figure 8A:
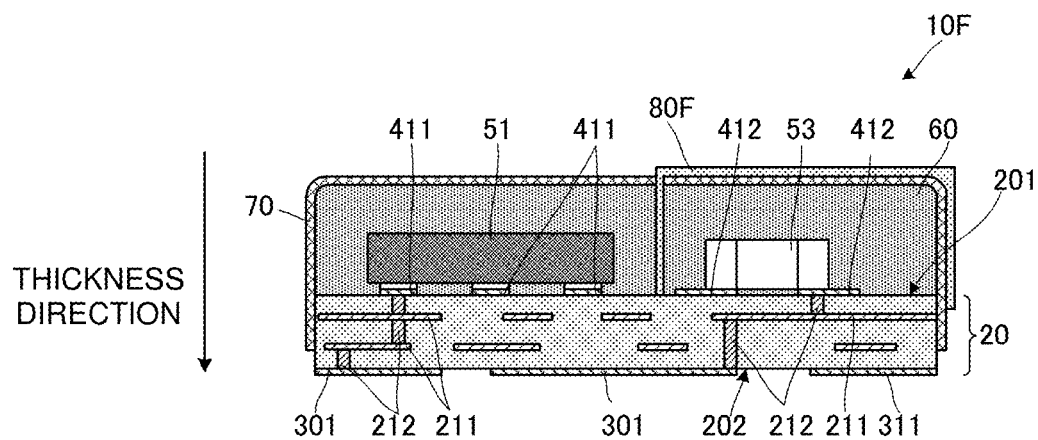
FIG. 8A is a side sectional view of an electronic component including a thin-film shield layer according to a seventh preferred embodiment of the present invention.
Figure 8B:
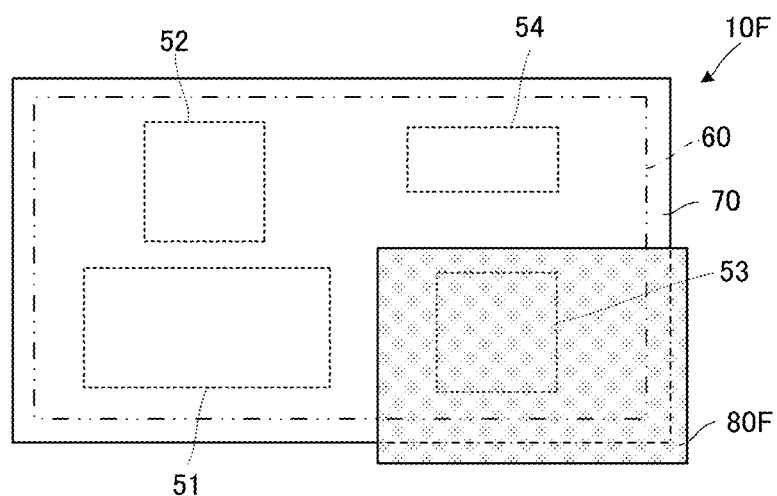
FIG. 8B is a schematic view when looking at the electronic component including the thin-film shield layer according to the seventh preferred embodiment of the present invention in plan.
Figure 8C:
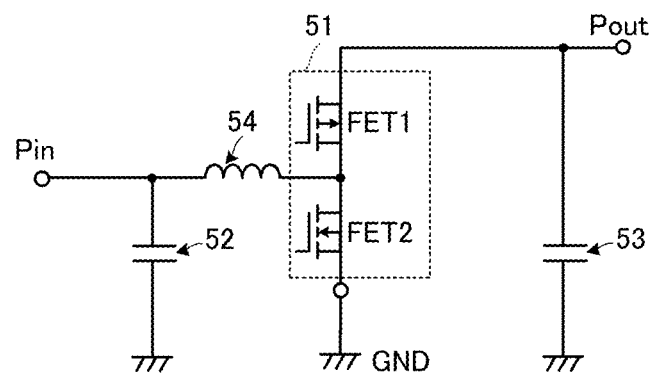
FIG. 8C is a circuit diagram of the electronic component including the thin-film shield layer according to the seventh preferred embodiment of the present invention.

An electronic component including a thin-film shield layer according to a seventh preferred embodiment of the present invention will be described below with reference to the drawings. FIG. 8A is a side sectional view of the electronic component including the thin-film shield layer according to the seventh preferred embodiment of the present invention. FIG. 8B is a plan view when looking at the electronic component including the thin-film shield layer from the thickness direction, namely from the side facing a top surface of the electronic component. FIG. 8C is a circuit diagram of the electronic component including the thin-film shield layer.

It is to be noted that, in FIGS. 8A and 8B, reference signs for elements are omitted as appropriate for easier recognition of a structure of the electronic component. In FIG. 8B, a portion of the elements is illustrated without hatching for easier understanding of the structure.

As illustrated in FIGS. 8A to 8C, comparing with the electronic component 10 including the thin-film shield layer according to the first preferred embodiment, the electronic component 10F including the thin-film shield layer according to the seventh preferred embodiment includes the surface mount devices 53 and 54 as in the electronic component 10, but it is different in feature with respect to a magnetic metal thin-film shield layer 80F. Other elements of the electronic component 10F including the thin-film shield layer are the same as or similar to those in the electronic component 10 including the thin-film shield layer, and description of the same or similar elements is omitted.

The electronic component 10F including the thin-film shield layer, illustrated in FIGS. 8A to 8C, is a step-up DC-DC converter module.

As illustrated in FIGS. 8A and 8B, the electronic component 10F including the thin-film shield layer includes the surface mount devices 51, 52, 53 and 54, and the magnetic metal thin-film shield layer 80F. For example, preferably, the surface mount device 51 is an IC chip, the surface mount device 52 is an input capacitor, the surface mount device 53 is an output capacitor, and the surface mount device 54 is a closed magnetic circuit choke-coil.

As illustrated in FIG. 8A, the magnetic metal thin-film shield layer 80F surrounds the top surface and the entire or substantially the entire lateral surface of the surface mount device 53. Furthermore, the metal thin-film shield layer 70 and the magnetic metal thin-film shield layer 80F cover the top surface of the surface mount device 53 and a portion of the lateral surface of the surface mount device 53, the portion being positioned close to a lateral surface of the electronic component 10F with the thin-film shield layer.

FIG. 8B is a plan view when looking at the structure illustrated in FIG. 8A in the thickness direction from the top surface side, and it represents that the magnetic metal thin-film shield layer 80F covers the top surface and the entire or substantially the entire lateral surface of the surface mount device 53.

FIG. 8C is a circuit diagram of the electronic component 10F including the thin-film shield layer. The surface mount device 51, which is the IC chip, includes a field effect transistor FET1 and a field effect transistor FET2. The surface mount device 52 and the surface mount device 54 are connected to an input terminal Pin. The surface mount device 51 is connected to one end of the surface mount device 54, and an output terminal Pout and the surface mount device 53 are connected to the other end of the surface mount device 51. The surface mount devices 51, 52 and 53 are connected to a ground GND.

With the above-described circuit, an input voltage applied to the input terminal Pin is stepped up and output from the output terminal Pout by turning ON and OFF the field effect transistors FET1 and FET2 of the surface mount device 51.

Because an input voltage at the input terminal Pin is higher than the output voltage at the output terminal Pout, the surface mount device 53, which is the output capacitor, is more likely to generate noise than the surface mount device 52 that is the input capacitor.

Thus, the noise is able to be effectively reduced or prevented by covering the entire or substantially the entire lateral surface and the top surface of the surface mount device 53 with the magnetic metal thin-film shield layer 80F.

With the above-described structure, the low frequency noise and the high frequency noise both generated from the surface mount device 53 are reduced or prevented by the metal thin-film shield layer 70 and the magnetic metal thin-film shield layer 80F.

Furthermore, the effect of shielding the low frequency noise and the high frequency noise generated from the surface mount devices 51 and 53 is able to be efficiently increased by selecting the metal thin-film shield layer 70 or the magnetic metal thin-film shield layer 80F to match the characteristics of the generated noises.

Alternatively, the surface mount devices 51 and 53 may be individually surrounded by separate sealing resin layers, and the sealing resin layers may each be surrounded by either one or both of the metal thin-film shield layer 70 and the magnetic metal thin-film shield layer 80F. Such a structure enables shields to match with the characteristics of the low frequency noise and the high frequency noise generated from the surface mount devices 51 and 53. As a result, the shielding effect is able to be increased with the above structure. In the above case, the shields may each be provided so as not to overlap with the lateral surface of the wiring substrate 20.

The present invention is not limited to the above-described structures of the preferred embodiments, and the present invention may be provided by variously modifying combinations of the preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component including a thin-film shield layer, the electronic component comprising:
   a wiring substrate;
   one or more surface mount devices mounted to a first principal surface of the wiring substrate;
   a metal thin-film shield layer including a nonmagnetic metal material and entirely or substantially entirely covering the one or more surface mount devices at a top surface side and a lateral surface side thereof, the metal thin-film shield layer including a top surface portion and a lateral surface portion; and
   a magnetic metal thin-film shield layer including a magnetic metal material and covering the top surface portion and the lateral surface portion of the metal thin-film shield layer, including an entire or substantially an entire edge portion at which the top surface portion and the lateral surface portion are joined to each other; wherein
   the magnetic metal thin-film shield layer defines at least a portion of an outermost surface of the electronic component on at least one of the top surface side and the lateral surface side; and
   the top surface portion and the lateral surface portion of the metal thin-film shield layer are in contact with the magnetic metal thin-film shield layer in a laminated state.

2. The electronic component including the thin-film shield layer according to claim 1, wherein
   a sealing resin layer covers the surface mount devices; and
   the metal thin-film shield layer is disposed on an outer side of the sealing resin layer.

3. The electronic component including the thin-film shield layer according to claim 2, wherein the sealing resin layer covers the first principal surface of the wiring substrate.

4. The electronic component including the thin-film shield layer according to claim 2, wherein the sealing resin layer is made of epoxy resin.

5. The electronic component including the thin-film shield layer according to claim 1, wherein
   the wiring substrate includes a ground electrode; and
   the metal thin-film shield layer is connected to the ground electrode.

6. The electronic component including the thin-film shield layer according to claim 1, wherein, when looking at the top surface portion of the metal thin-film shield layer in plan view, the metal thin-film shield layer includes an opening in a region overlapping with at least one of one or more the surface mount devices.

7. The electronic component including the thin-film shield layer according to claim 6, wherein the sealing resin layer includes alumina or silica.

8. The electronic component including the thin-film shield layer according to claim 1, wherein the magnetic metal thin-film shield layer entirely or substantially entirely covers a portion of one or more surface mount devices at the top surface side and the lateral surface side thereof.

9. The electronic component including the thin-film shield layer according to claim 1, wherein the one or more surface mount devices include a plurality of the surface mount devices.

10. The electronic component including the thin-film shield layer according to claim 1, wherein the wiring substrate is made of glass epoxy.

11. The electronic component including the thin-film shield layer according to claim 1, wherein
    the wiring substrate includes conductor patterns and interlayer connection conductors;
    each of the conductor patterns extends in a direction perpendicular or substantially perpendicular to a thickness direction of the wiring substrate; and
    each of the interlayer connection conductors extends in a direction parallel to the thickness direction.

12. The electronic component including the thin-film shield layer according to claim 11, wherein a portion of the conductor patterns is exposed at a lateral surface of the wiring substrate.

13. The electronic component including the thin-film shield layer according to claim 11, further comprising:
- device land conductors provided on the first principal surface of the wiring substrate; and
- a ground terminal conductor and an external connection terminal conductor provided on a second principal surface of the wiring substrate; wherein
- the device land conductors are connected to the ground terminal conductor and the external connection terminal conductor via the conductor patterns and the interlayer connection conductors.

14. The electronic component including the thin-film shield layer according to claim 13, wherein the one or more surface mount devices are mounted to the device land conductors.

15. The electronic component including the thin-film shield layer according to claim 1, wherein the metal thin-film shield layer covers a portion of a lateral surface of the wiring substrate.

16. The electronic component including the thin-film shield layer according to claim 1, wherein a thickness of the metal thin-film shield layer is about 3 μm to about 5 μm.

17. The electronic component including the thin-film shield layer according to claim 1, wherein the edge portion of the metal thin-film shield layer has a curvature.

18. An electronic component including a thin-film shield layer, the electronic component comprising:
- a wiring substrate;
- one or more surface mount devices mounted to a first principal surface of the wiring substrate;
- a metal thin-film shield layer including a nonmagnetic metal material and entirely or substantially entirely covering the one or more surface mount devices at a top surface side and a lateral surface side thereof, the metal thin-film shield layer including a top surface portion and a lateral surface portion; and
- a magnetic metal thin-film shield layer including a magnetic metal material and covering the top surface portion and the lateral surface portion of the metal thin-film shield layer, including an entire or substantially an entire edge portion at which the top surface portion and the lateral surface portion are joined to each other; wherein
- the wiring substrate is a magnetic substrate including a magnetic layer.

19. An electronic component including a thin-film shield layer, the electronic component comprising:
- a wiring substrate;
- one or more surface mount devices mounted to a first principal surface of the wiring substrate;
- a metal thin-film shield layer including a nonmagnetic metal material and entirely or substantially entirely covering the one or more surface mount devices at a top surface side and a lateral surface side thereof, the metal thin-film shield layer including a top surface portion and a lateral surface portion;
- a magnetic metal thin-film shield layer including a magnetic metal material and covering the top surface portion and the lateral surface portion of the metal thin-film shield layer, including an entire or substantially an entire edge portion at which the top surface portion and the lateral surface portion are joined to each other; and
- a resin layer containing a magnetic material; wherein
- the resin layer entirely or substantially entirely covers one or more the surface mount devices at the top surface side and the lateral surface side thereof.

* * * * *